United States Patent [19]

Betz et al.

[11] Patent Number: 5,192,477
[45] Date of Patent: Mar. 9, 1993

[54] SURFACE TREATMENT OF POLYAMIDE MOLDINGS

[75] Inventors: Walter Betz, Ludwigshafen; Gerd Blinne, Bobenheim, both of Fed. Rep. of Germany

[73] Assignee: BASF Aktiengesellschaft, Ludwigshafen, Fed. Rep. of Germany

[21] Appl. No.: 758,721

[22] Filed: Sep. 9, 1991

Related U.S. Application Data

[63] Continuation of Ser. No. 527,941, May 24, 1990, abandoned.

[30] Foreign Application Priority Data

Jun. 14, 1989 [DE] Fed. Rep. of Germany ....... 3919367

[51] Int. Cl.$^5$ ............................ B05D 3/10; B29C 41/20
[52] U.S. Cl. ..................................... 264/129; 264/233; 264/340; 427/306
[58] Field of Search ............... 264/129, 232, 233, 340, 264/343; 427/304, 306; 8/130.1; 528/487, 502

[56] References Cited

U.S. PATENT DOCUMENTS 3,551,331 12/1970 Cescon et al. .................. 264/340 X
3,653,806 4/1972 Matsuda et al. ...................... 8/130.1

FOREIGN PATENT DOCUMENTS 56986 8/1982 European Pat. Off. .
50-76 1/1975 Japan .

OTHER PUBLICATIONS

Seidenspinner, H. M., "Probleme Bei Der Metallisierung Von Polyamid", *Galvanotechnik*, vol. 75, No. 7 (1984), pp. 852–854.
Wolf, G. D. et al., "Metallisierung Von Polyamid-Spritzgubteilen", *Galvanotechnik*, vol. 79, No. 1 (1988), pp. 54–59.
Chemical Abstracts, vol. 81, 1974, p. 127, 122724g.
Chemical Abstracts, vol. 82, 1975, p. 57, 157459x.

*Primary Examiner*—Leo B. Tentoni
*Attorney, Agent, or Firm*—Oblon, Spivak, McClelland, Maier & Neustadt

[57] ABSTRACT

A process for the surface treatment of moldings based on polyamides by treatment with an aqueous acid, wherein the aqueous acid used is a 30–85% strength solution of $H_3PO_4$ yields moldings which are readily metallizable. Metallized moldings obtained by this process are useful in the production of automobiles and in the electronics industry.

6 Claims, No Drawings

SURFACE TREATMENT OF POLYAMIDE MOLDINGS

This application is a continuation of application Ser. No. 07/527,941, filed on May 24, 1990, now abandoned.

BACKGROUND OF THE INVENTION

1. Field of the Invention:

The present invention relates to a process for the surface treatment of moldings based on polyamides by treatment with aqueous acids.

The present invention furthermore relates to moldings obtainable by this process and their use for metallization, ie. for coating with metals.

2. Description of the Background

Polyamides belong to the class consisting of the engineering plastics and are widely used in many areas.

In one interesting application, the area of metallized materials, polyamides have however largely not been used to date. This is due mainly to the inadequate adhesion of the metal layer to the polyamide. This problem is discussed in an article by Seidenspinner (Galvanotechnik 75 (1984), 852) and various solutions, for example treatment with aqueous hydrochloric acid, are suggested. Galvanotechnik 79 (1988), 54 describes a process for the surface treatment of polyamide injection moldings, in which the surface is first activated in a bath containing palladium salts and then roughened in a bath containing calcium salts and aluminum salts. This process uses expensive materials and is therefore economically disadvantageous on the one hand and on the other hand the adhesive strengths achieved are still not completely satisfactory.

EP-A 56 986 discloses polyamide molding materials which contain from 30 to 60% by weight of wollastonite as a filler and are particularly suitable for metallization. The pretreatment is carried out using a 4–15% strength solution of hydrochloric acid or sulfuric acid, roughening of the surface being achieved through attack on the filler particles, ie. the filler is essential for achieving good adhesion between metal and polyamide. Because of the high filler content, however, the quality of the surface is adversely affected, which is disadvantageous in applications in the decorative sector.

It is an object of the present invention to provide a process for the surface treatment of moldings based on polyamides, which should subsequently be readily metallizable, the said process avoiding the disadvantages described above.

SUMMARY OF THE INVENTION

We have found that this object is achieved, according to the invention, by a process for the surface treatment of moldings based on polyamides by treatment with an aqueous acid, wherein the aqueous acid used is a 30–85% strength by weight solution of $H_3PO_4$. The data in percentages by weight are based on a temperature of 20° C.; at higher temperatures, $H_3PO_4$ solutions having a content of more than 85% by weight are also obtainable.

DESCRIPTION OF THE PREFERRED EMBODIMENTS

The novel process is suitable for the surface treatment of moldings based on polyamides, ie. moldings which contain a thermoplastic polyamide as an important component. The said polyamide may be modified with fillers, polymers which improve the impact strength, further polymers or flameproofing agents.

Suitable polyamides are known per se and comprise the semicrystalline and amorphous resins which have weight average molecular weights of not less than 5,000 and are usually referred to as nylon. Such polyamides are described in, for example, U.S. Pat. Nos. 2,071,250, 2,071,251, 2,130,523, 2,130,948, 2,241,322, 2,312,966, 2,512,606 and 3,393,210.

The polyamides can be prepared, for example, by condensation of equimolar amounts of a saturated or of an aromatic dicarboxylic acid of 4 to 12 carbon atoms with a diamine of 4 to 14 carbon atoms, or by condensation of ω-aminocarboxylic acids or polyaddition of lactams. Examples of polyamides are polyhexamethyleneadipamide (nylon 66), polyhexamethyleneazelaamide (nylon 69), polyhexamethylenesebacamide (nylon 610), polyhexamethylenedodecanediamine (nylon 612), the polyamides obtained by subjecting lactams to ring-opening reactions, such as polycaprolactam, polylaurolactam, poly-11-aminoundecanoic acid and a polyamide obtained from di-(p-aminocyclohexyl)-methane and dodecanedioic acid. It is also possible to use polyamides which have been prepared by copolycondensation of two or more of the abovementioned polymers or their components, for example a copolymer of caprolactam, terephthalic acid and hexamethylenediamine. The polyamides are preferably linear and have melting points of more than 200° C.

Preferred polyamides are polyhexamethyleneadipamide, polyhexamethylenesebacamide and polycaprolactam. The polyamides generally have a relative viscosity of from 2.5 to 5, determined using a 1% strength by weight solution in 96% strength sulfuric acid at 23° C. which corresponds to a weight average molecular weight of from about 15,000 to about 45,000. Polyamides having a relative viscosity of from 2.5 to 4.0, in particular from 2.6 to 3.5, are preferably used.

Processes for the preparation of such polyamides are known per se and are described in the literature.

Another group of particularly suitable polyamides comprises the partly aromatic copolyamides described in EP-A 299 444 and obtained from ε-caprolactam, terephthalic acid and hexamethylenediamine or adipic acid, terephthalic acid and hexamethylenediamine. For further details on these polyamides, reference may be made to EP-A 299 444 itself.

Fillers, polymers which modify the impact strength and flameproofing agents for polyamides are known per se to the skilled worker and are described in the literature, so that no further information is required here.

A polymer blend of polyamide and polyphenylene ether may be mentioned here merely as a typical example of a blend of polyamide and another polymer.

The production of the moldings from the polyamide molding materials described above can be carried out by the methods known to the skilled worker, for example by extrusion, injection molding or blow molding, to mention but three methods. The processing conditions depend of course on the composition of the polyamide molding material and are known to the skilled worker.

The surface treatment of the moldings based on polyamides is carried out with the aid of a 30–85, preferably 40–75, % strength by weight solution of phosphoric acid ($H_3PO_4$). The duration and temperature of the treatment are interdependent; the higher the temperature, the shorter, as a rule, is the duration of treatment.

A temperature of from 10° to 60° C., in particular from 15° to 45° C., is preferred.

The duration of treatment is preferably from 5 to 120 s, in particular from 10 to 60 s, particularly preferably from 10 to 30 s.

In has proven advantageous if, at a concentration of phosphoric acid of from 40 to 75% by weight, the product of the treatment temperature in degrees Centigrade and the duration of treatment in seconds is from 200 to 2,400, since particularly good adhesion is achieved in the metallization of moldings pretreated in this manner.

It has also proven advantageous if the phosphoric acid used for the surface treatment contains further additives.

Examples of further additives are
a) aqueous solutions of a polyvinylimidazole containing cationic groups or
b) organic ethers of the general formula $$R^2O-(CH_2)_n-OR^1,$$

where $R^1$ and $R^2$ are each hydrogen, $C_1$-$C_{10}$-alkyl or aryl and n is an integer of from 2 to 10, or
c) chlorides of a divalent or tetravalent metal.

According to the invention, polyvinylimidazoles containing cationic groups should be understood as meaning polyvinylimidazoles which contain a quaternary nitrogen cation.

Such additives are generally known and are commercially available (eg. Basotronic® PVI). For further details, reference may be made to DE-A 37 43 740 and to DE-A 37 43 741, DE-A 37 43 742, DE-A 37 43 743 and DE-A 37 43 744, which describe further polymers which contain quaternary groups and can also be used as additive a).

Organic ethers of the above general formula preferably contain a hydrogen $R^1$ or $R^2$ and have n=2, ethylene glycol monomethyl ether being particularly preferred.

The additives a) or b) are present in amounts of from 0.1 to 30, preferably from 0.5 to 20, in particular from 1 to 15, % by weight, based on 100% by weight of the surface treatment solution. Furthermore, mixtures of additives a) and b) can also be used, any mixing ratio being possible.

Examples of additives c) are chlorides of zinc and of tin, which are present in amounts of from 0.1 to 10 g, preferably from 0.2 to 8 g, based on 1 l of aqueous $H_3PO_4$.

After the pretreatment, the moldings are advantageously freed from adhering acid radicals by washing in water.

Thereafter, the moldings can be metallized in a conventional manner known per se.

For this purpose, as a rule activation is first carried out, then reduction and thereafter chemical metallization, which is followed by electroplating as a final step.

The products obtained possess particularly high adhesive strength, in general from 1.25 to 5 N/mm (measured according to DIN 53,289 by the floating roller peel test). The products, which have been pretreated with aqueous $H_3PO_4$ and the additives a) to c), have a generally smooth, scarcely roughened surface and achieve high as well as uniform adhesive strengths over the entire surface of the molding.

As a result of the treatment with the phosphoric acid, the amino groups of the polyamide which are present in the surface layer are modified by reaction with $H_3PO_4$, not less than 5 mol % of the amino groups originally present being changed in a surface layer not more than 100 μm thick in order to achieve particularly good results.

From the above, it is evident that the novel moldings are particularly suitable for subsequent metallization. The metallized moldings thus obtained can be used in many areas, for example in the automotive sector or in the field of electrical engineering and electronics. The use of moldings based on partly aromatic copolyamides according to EP-A 299 444 for the production of injection molded printed circuit boards may be mentioned in particular here.

Moreover, moldings treated by the novel process can also readily be coated and printed.

EXAMPLES

A 2.0 mm thick sheet of a partly aromatic copolyamide composed of units derived from ε-caprolactam and terephthalic acid/hexamethylenediamine in a weight ratio of 70:30 (prepared according to Example 1 of EP-A 299 444), having a relative viscosity of 2.50, measured in 96% strength $H_2SO_4$ (1 g/100 ml) at 25° C., was treated with an aqueous solution of $H_3PO_4$, which was at the temperature stated in the Table, for the periods stated in the Table. Thereafter, the sheet obtained was washed with distilled water and dried.

Metallization was carried out in a manner known per se, a 25–50 μm thick copper layer being obtained on the polyamide sheet as the end result.

The results of the floating roller peel test according to DIN 53,289 and the thermal cycling test according to DIN 53,496 are likewise shown in the Table.

For comparison, identical polyamide sheets were pretreated with aqueous solutions of other acids (according to the Table) and metallized in an identical manner. The results are likewise shown in the Table.

TABLE

| Experiment No. | Acid used | Treatment Temp. | Time | Mean peel resistance N/mm (according to DIN 53,289) | Thermal cycling test (according to DIN 53,496) |
|---|---|---|---|---|---|
| 1 | $H_3PO_4$ conc. | RT[2)] | 20 sec | >3.0 | Passed |
| 2 | 70% of $H_3PO_4$ | 40° C. | 10 sec | 0.5–0.8 | Passed |
| 3 | 70% of $H_3PO_4$ | 40° C. | 20 sec | 1.5–3.0 | Passed |
| 4 | 70% of $H_3PO_4$ | 40° C. | 30 sec | 2.0–4.5 | Passed |
| 5 | 95% by wt. of 85% $H_3PO_4$ + 5% by wt. of additive a) | RT | 20 sec | 1.1–1.3 | Passed |
| 6*) | 95% by wt. of 70% $H_3PO_4$ + 5% by wt. of additive a) | RT | 300 sec | 1.1–1.3 | Passed |
| 7 | 90% by wt. of 85% $H_3PO_4$ + 10 % by wt. of additive b) | RT | 30–60 sec | 0.6–0.9 | Passed |
| 8 | 85% by wt. of 85% $H_3PO_4$ + 15% by wt. of additive b) | RT | 30–60 sec | 0.6–0.9 | Passed |

TABLE-continued

| Experiment No. | Acid used | Treatment Temp. | Time | Mean peel resistance N/mm (according to DIN 53,289) | Thermal cycling test (according to DIN 53,496) |
| --- | --- | --- | --- | --- | --- |
| 9*) | 85% by wt. of 70% $H_3PO_4$ + 15% by wt. of additive a) | RT | 300 sec | 0.6–0.9 | Passed |
| 10 V | HCl conc. | 30° C. | 20 sec | −1 | Not passed |
| 11 V | 20% HCl | RT | 10–1200 sec | <0.1 | Not passed |
| 12 V | $H_2SO_4$ | RT | 10–420 sec | <0.1 | Not passed |
| 13 V | Chromosulfuric acid | RT | 20 sec | −1 | Not passed |
| 14 V | HCOOH (75% by wt.) | RT | 420 sec | 0.1–0.3 | Not passed |
| 15 V | $CH_3COOH$ conc. | RT | 10–1800 sec | <0.1 | Not passed |
| 16 V | $HNO_3$ conc. | RT | 20 sec | <0.1 | Not passed |
| 17 V | $CCl_3COOH$ conc. | 60° C. | 30 sec | <0.1 | Not passed |
| 18 V | NaOCl + HCl conc. | 60° C. | 10–7200 sec | <0.1 | Not passed |

V = Comparative Experiment
1)No adhesion measurable since molding is destroyed by acid used
2)RT = Room temperature (21° C.)
*)Experiments 6 and 9 were optimized to automated processes with a 5 minute cycle (residence time in the pretreatment bath).
Additive a) poyvinylimidazole containing quaternary nitrogen cation (40% strength solution in water)
Additive b) ethylene glycol monomethyl ether

We claim:

1. A process for treating a surface of a polyamide molding, comprising
   (i) contacting said surface with an aqueous acid, wherein said aqueous acid is a 30 to 85% strength by weight solution of $H_3PO_4$ and wherein said $H_3PO_4$ solution further comprises an additive selected from the group consisting of
      a) a polyvinylimidazole containing cationic groups,
      b) an organic ether, and
      c) a chloride of a divalent or tetravalent metal, to obtain a treated surface; and
   (ii) metallizing said treated surface.

2. A process as claimed in claim 1, wherein said contacting with $H_3PO_4$ is carried out at a temperature of from 10° to 60° C.

3. A process as claimed in claim 1, wherein said contacting with $H_3PO_4$ is carried out for a period of time of from 5 to 120 sec.

4. A process as claimed in claim 1, wherein said $H_3PO_4$ solution comprises from 0.1 to 30% by weight of an aqueous solution of a polyvinylimidazole containing cationic groups.

5. A process as claimed in claim 1, wherein said $H_3PO_4$ solution comprises from 0.1 to 10 g/l of a chloride of a divalent or tetravalent metal.

6. A process as claimed in claim 1, wherein said $H_3PO_4$ solution comprises from 0.5 to 30% by weight of an organic ether.

* * * * *